United States Patent [19]
Kawasumi

[11] Patent Number: 5,476,815
[45] Date of Patent: Dec. 19, 1995

[54] MANUFACTURING METHOD OF SEMICONDUCTOR DEVICE

[75] Inventor: Yasushi Kawasumi, Fujisawa, Japan

[73] Assignee: Canon Kabushiki Kaisha, Tokyo, Japan

[21] Appl. No.: 277,133

[22] Filed: Jul. 19, 1994

Related U.S. Application Data

[63] Continuation of Ser. No. 126,030, Sep. 24, 1993, abandoned, which is a continuation of Ser. No. 886,391, May 21, 1992, abandoned.

[30] Foreign Application Priority Data

May 23, 1991 [JP] Japan ................... 3-118738

[51] Int. Cl.⁶ ................................. H01L 21/441
[52] U.S. Cl. .................. 437/192; 437/194; 437/195
[58] Field of Search ................... 437/194, 195, 437/192

[56] References Cited

U.S. PATENT DOCUMENTS 3,761,309  9/1973  Schmitter ...................... 437/194 X
5,180,687  1/1993  Mikoshiba et al. .............. 437/194 X

FOREIGN PATENT DOCUMENTS 349696   10/1990  European Pat. Off. .
0349696  10/1990  European Pat. Off. .
0420597   4/1991  European Pat. Off. .
0425084   5/1991  European Pat. Off. .
3818509  12/1988  Germany .
3815569  12/1988  Germany .

Primary Examiner—John S. Maples
Attorney, Agent, or Firm—Fitzpatrick, Cella, Harper & Scinto

[57]  ABSTRACT

A method of manufacturing a semiconductor device having a bonding pad portion. A wiring is formed on a substrate and an insulative protective film is formed onto the wiring. An opening portion is exposed and serves as the bonding pad portion in which a surface of a part of the wiring is exposed. A metal film is selectively grown only in this opening position.

3 Claims, 4 Drawing Sheets

MANUFACTURING METHOD OF SEMICONDUCTOR DEVICE

This application is a continuation of application Ser. No. 08/126,030 filed Sep. 24, 1993, now abandoned, which is a continuation of application Ser. No. 07/886,391 filed May 21, 1992, now abandoned.

BACKGROUND OF THE INVENTION

1. Field of the Invention

The invention relates to a method of manufacturing a semiconductor device and, more particularly, to a method of forming a bonding pad.

2. Related Background Art

FIGS. 1 and 2 are respectively a cross sectional view and a plan view showing a state in which a protecting film is formed on a bonding pad portion by a conventional method.

Reference numeral 1 denotes a semiconductor substrate; 2 a wiring; 3 an insulating layer; 4 an opening portion; and 4' a contact hole.

To date there is a method of manufacturing a monolithic IC as a device in which a number of active elements such as transistors and a number of passive elements such as resistors are formed on the same substrate and wirings among those elements are connected and one circuit or system is constructed. According to such a conventional manufacturing method, the Al or Al alloy wiring 2 having a thickness of about 0.8 to 1.6 μm is formed on the substrate 1 by a sputtering method, thereby forming a desired pattern by a photolithography step. The pattern formed as mentioned above is generally patterned so as to include an electrode portion for lead connection, namely, a bonding pad having a size of about 50 to 100 square μm in order to lead out a signal from the device to the outside. An SiN film as a protecting film 3 is subsequently formed by a plasma CVD method and a bonding pad portion is opened.

A thin metal wire 14 of Al or Au is bonded to the opening portion 4 and is connected to an external terminal 15 of the package. In the case of TAB (tape automatic bonding), after the bonding pad portion was opened, a contact barrier layer as an Au layer having a thickness of about 1000 to 2000 Å and a thick resist layer are coated and the resist on the bonding pad is eliminated by development. After that, an Au film of a thickness of about 25 μm is formed by an electro-plating and the resist and the contact barrier layer are eliminated, thereby forming a bump. After that, a tape bonding is performed.

In the above conventional method, it is desirable to set a film thickness of the wiring of the bonding pad portion to a value of 0.6 μm or more from a viewpoint of an adhesion strength with the bonding wire. That is, when the film thickness of wiring metal of the bonding pad portion is thick, the pad portion is softly deformed upon bonding, so that an enough adhesion strength is obtained. However, due to the improvement of an integration degree of the IC and the realization of an advanced function, the bonding pad portion cannot always satisfy the condition as mentioned above. For instance, as for the film thickness of wiring, it is inevitable to make the film thin in order to reduce the line width and the pitch between lines. As for the wiring material, a metal of a high melting point such as W, Mo, Ti, or the like or its silicide is used in place of the conventional Al or Al alloy, so that a large problem occurs for the adhesion strength.

On the other hand, there are problems such an in the case of forming the bump, the formation of the contact barrier layer and the electro-plating are necessary and a processing time is long, and in the eliminating step of the contact barrier layer, there is a possibility of the occurrence of a defect in the protecting film, and the like.

SUMMARY OF THE INVENTION

It is an object of the invention to provide a method of manufacturing a semiconductor device in which enough adhesion strength is obtained upon wiring of bonding.

A manufacturing method of a semiconductor according to the invention comprises the steps of: forming wirings of one or more layers made of an electron donative material onto a substrate; forming a protecting film made of a non-electron donative material onto the electron donative material so as to have a desired pattern shape and forming an opening portion serving as a bonding pad portion in which the surface of the electron donative material is exposed; and selectively growing a metal film into the opening portion.

According to the invention, in the case of performing the wire bonding by growing the metal in the bonding pad portion in which the protecting film is opened by the selective CVD method, the wire bonding can be easily realized with high reliability. In the case of executing the TAB, the conventional bump forming process can be omitted.

DETAILED DESCRIPTION OF THE PREFERRED EMBODIMENTS

Embodiments of the invention will be practically described hereinbelow with reference to the drawings.

(Embodiment 1)

Figure 1:
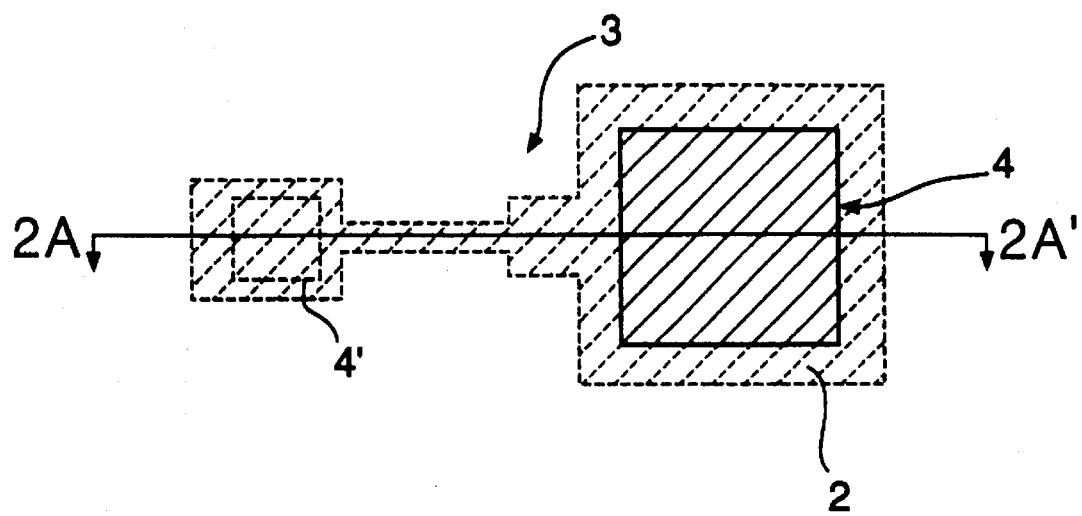
FIG. 1 is a schematic plan view showing a conventional bonding pad.
Figure 2:
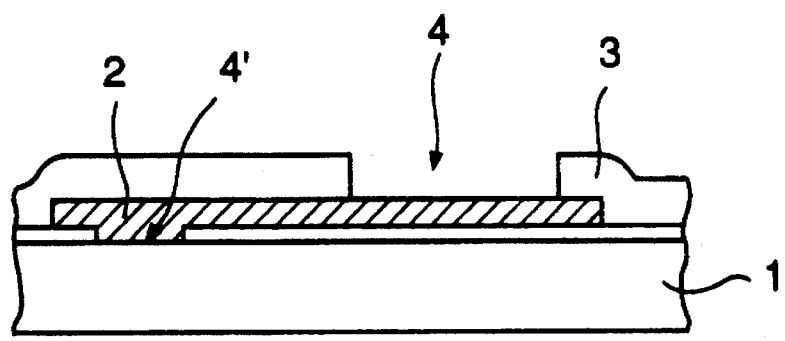
FIG. 2 is a cross sectional view taken along the line 2—2 in FIG. 1.

In FIG. 1, the case of performing a wiring of one layer will be explained. However, actually, it should be noted that there is a case of multilayer wirings such that a plurality of wirings are laminated through inter-layer insulating films in accordance with the application and scale of the elements formed on the substrate.

Figure 4:
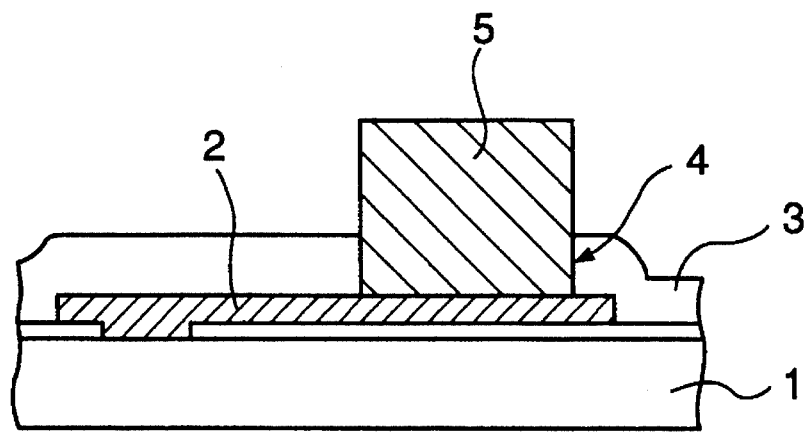
FIGS. 4 and 5 are schematic diagrams for explaining the TAB according to an embodiment of the present invention.

FIG. 4 is a cross sectional view of an integrated circuit for explaining an embodiment in the case where a bump corresponding to the TAB is formed by selectively forming a metal onto a bonding pad portion.

An element is formed onto the Si substrate 1. A film of the wiring 2 made of Al—Si having a thickness of 0.6 to 1.2 μm is formed by a sputtering method and patterned by a photolithography process. An SiN film as a protecting film 3 having a thickness of 0.8 to 2 μm is formed by a plasma CVD method and the opening portion 4 serving as a bonding pad portion is formed by patterning. The above processing steps are almost the same as those shown in FIG. 1.

DMAH (dimethyl aluminum hydride) is used as a raw material gas, a substrate temperature is set to 300° C., a total pressure is set to 1.5 Torr, and a partial pressure of DMAH is set to $5 \times 10^{-3}$ Torr. $H_2$ is used as a reaction gas and an Al film 5 as a metal is formed in the opening portion 4 by a CVD method.

Since Al—Si is an electron donative material as will be explained later, an Al film is selectively deposited onto the Al—Si layer. On the other hand, since SiN is a non-electron donative material as will be explained later, no Al film is formed onto the SiN layer.

Although a thickness of Al film can be arbitrarily selected, it is necessary to set the Al film thickness to be thicker than the thickness of the protective film in order to use the Al film as a bump. A thickness of 20 to 30 μm is proper. The growth of the Al film progresses so as to bury the opening portion 4 of the protecting film 3. Even after the opening portion 4 was buried, the growth of the Al film continues as it is in the vertical direction. The growth in the lateral direction changes in accordance with the growing conditions of the Al film.

Figure 5:
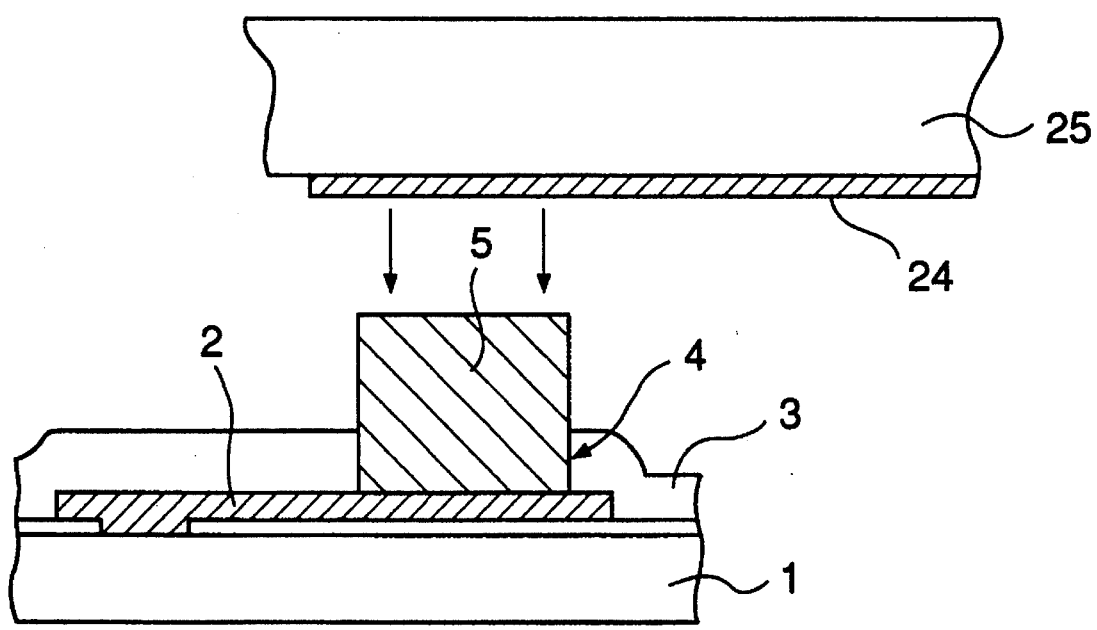

Subsequently, a TAB film 25 formed with a wiring 24 is bonded to the semiconductor device as shown in FIG. 5, thereby obtaining an electrical connection. That is, the wiring 24 and bump 5 as connecting members are bonded and electrically connected.

According to the embodiment, the formation of the contact barrier layer, the electro-plating, and the like as in the conventional method are unnecessary when a bump requiring a relatively large thickness is formed, so that the TAB step is fairly simplified.

(Embodiment 2)

Figure 6:
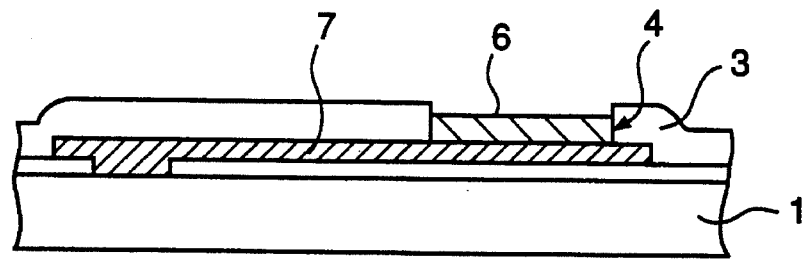
FIGS. 6 and 7 are schematic diagrams for explaining the wire bonding according to another embodiment of the invention.

FIG. 6 is a cross sectional view of an integrated circuit for explaining another embodiment in the case where a bonding pad portion corresponding to a wire bonding is formed by using the invention.

An element is formed on the Si substrate 1. A film of the wiring made of a metal of a high melting point or its silicide is formed. The protecting film 3 is subsequently formed and patterned, thereby forming the opening portion 4 serving as a bonding pad portion. When a thickness of Al film is equal to or larger than 0.6 μm, the wire bonding can be sufficiently performed. In order to reduce the depositing time, it is sufficient to set a thickness of Al film to a value of 0.6 to 2 μm. In this manner, a bonding buffer film 6 is formed.

In the case of the embodiment 2, since the metal of a high melting point and its silicide are electron donative materials as will be explained hereinlater, Al is selectively deposited onto such a material. Since the protecting film is a non-electron donative material, no Al is deposited onto such a material.

As for a film thickness of the wiring, when a thickness of Al—Si film is larger than 0.6 μm, the wire bonding can be sufficiently performed as it is and there is no need to apply the invention.

Figure 7:
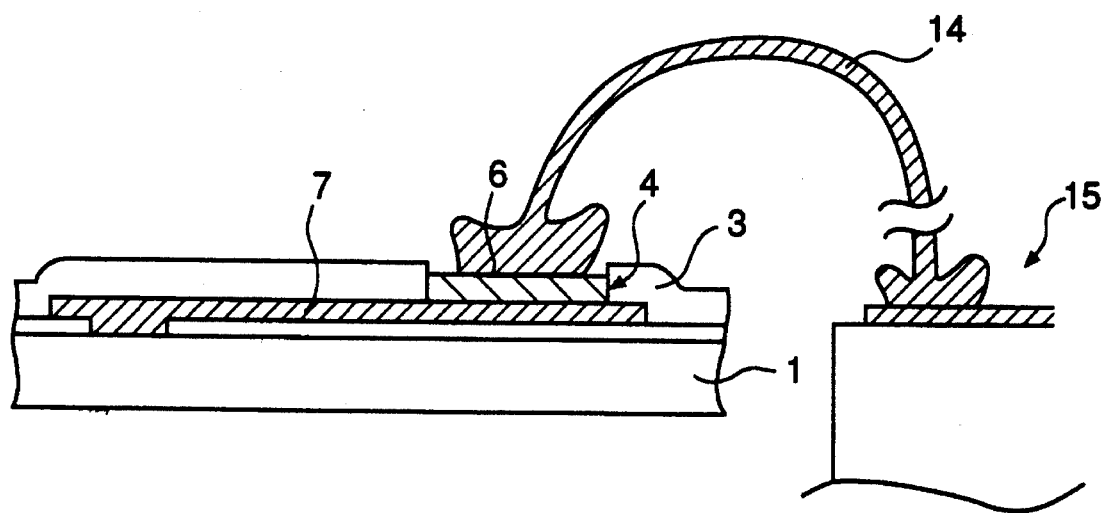

The bonding is subsequently executed as shown in FIG. 7. That is, the metal 6 of the pad portion and the wire 14 as a connecting member are connected.

It is desirable to apply the invention when the wiring of the bonding pad portion is made of Al of a thickness equal to or less than 0.6 μm or an alloy such as Al—Si, Al—Ti, Al—Cu, Al—Si—Ti, or the like, or when the wiring material is made of a metal of a high melting point other than Al or its silicide. Although the embodiments 1 and 2 have been described with respect to the case where the wiring of one layer was performed, the invention can also be obviously applied to the case of multi-layer wirings.

As a forming method of the metal film which is used for the bonding pad portion of the invention, the CVD method using alkyl aluminum hydride mentioned above is preferably used. The CVD method is disclosed in detail in the Official Gazette of European Patent Publication No. 0425084.

A selective CVD method using triisobutyl aluminum (TiBA), a selective CVD method using $WF_6$, or the like can also be used although they are inferior to the above CVD method with respect to the effect.

According to the foregoing CVD method using alkyl aluminum hydride, the substrate material on which the metal film is selectively deposited is an electron donative material.

The electron donative material is a material such that free electrons exist in the substrate or free electrons are purposely generated. For instance, the electron donative material denotes a material having the surface in which a chemical reaction is promoted by the transmission and reception of electrons to/from the molecules of the raw material gas deposited on the substrate surface. For example, generally, a metal or a semiconductor corresponds to such a material. A material such that a thin oxide film exists on the metal or semiconductor surface is also included in such a material. This is because a chemical reaction occurs by the electron transmission and reception between the substrate and the deposited raw material molecules.

Practically speaking, the electron donative materials include: semiconductors of monocrystalline silicon, polycrystalline silicon, amorphous silicon, etc.; III-V group compound semiconductors of the binary system, ternary system, or quadruple system which are constructed by combining Ga, In, and Al as III group elements and P, As, and N as V group elements; metals such as tungsten, molybdenum, tantalum, tungsten silicide, titanium silicide, aluminum, aluminum silicon, titanium aluminum, titanium nitride, copper, aluminum silicon copper, aluminum palladium, titanium, molybdenum silicide, tantalum silicide, and the like, alloys of them, and their silicides; and the like.

On the other hand, as a material which forms the surface on which the metal is not selectively deposited, namely, as a non-electron donative material, there can be mentioned: silicon oxide by a thermal oxidation, a CVD, or the like; a glass or an oxide film of BSG, PSG, BPSG, or the like; a thermal nitride film of silicon; a silicon nitride film by a plasma CVD, a pressure reducing CVD, an ECR-CVD method, etc.

In the embodiment 1, the Al film has been formed onto the Al—Si wiring as an electron donative material by using DMAH and $H_2$. However, the following method can also be used as a selective depositing method of the Al film (hereinafter, abbreviated to an Al-CVD method).

Monomethyl aluminum hydride is used as a raw material gas, an $H_2$ gas is used as a reaction gas, and the substrate surface is heated under the mixture gas of them, so that the Al film of a good quality can be deposited. When the Al film is selectively deposited, it is preferable to keep the surface temperature of the substrate to a value which is equal to or higher than a decomposition temperature of alkyl aluminum hydride and is lower than 45° C. by the direct heating or indirect heating. More desirably, it is set to a value which is equal to or higher than 260° C. and is equal to or lower than

440° C.

There is a direct heating method and an indirect heating method as a method of heating the substrate to a temperature within the above temperature range. Particularly, by holding the substrate to the above temperature by direct heating, the Al film of good quality can be formed at a high depositing speed. For instance, when the substrate surface temperature at the time of formation of the Al film is set to a value within a more preferable temperature range of 260° to 440° C., the film of good quality can be obtained at a higher depositing speed such as 300 to 5000 Å/minute than the speed in the case of the resistor heating. For example, a lamp heating by using a halogen lamp, a xenon lamp, or the like can be mentioned as such a direct heating method (the energy from the heating means is directly transferred to the substrate and the substrate itself is heated). On the other hand, there is a resistor heating as an indirect heating method and such an indirect heating can be performed by using a heat generating element or the like provided for a substrate supporting material arranged in the space to form a deposition film to support the substrate on which the deposition film should be formed.

By the above method, when the CVD method is applied to the substrate on which both the electron donative surface portion and the non-electron donative surface portion exist, a monocrystal of Al is formed in only the electron donative substrate surface portion with a good selectivity.

In the embodiments 1 and 2, the Al film has been formed. According to the Al-CVD method, however, the following metal film made of Al as a main component can be also selectively deposited and its film quality also exhibits excellent characteristics.

For example, in addition to the gas of alkyl aluminum hydride and hydrogen, the gas containing Si atoms such as $SiH_4$, $Si_2H_6$, $Si_3H_8$, $Si(CH_3)_4$, $SiCl_4$, $SiH_2Cl_2$, $SiHCl_3$, etc., the gas containing Ti atoms such as $TiCl_4$, $TiBr_4$, $Ti(CH_3)_4$, etc., and the gas containing Cu atoms such as bisacetyl acetonato copper $Cu(C_5H_7O_2)$, bisdipivaloyl metanite copper $Cu(C_{11}H_{19}O_2)_2$, bis hexafluoro acetyl acetonato copper $Cu(C_5HF_6O_2)_2$, or the like are properly combined and introduced to thereby forming a gas mixture atmosphere. For instance, a conductive material such as Al—Si, Al—Ti, Al—Cu, Al—Si—Ti, Al—Si—Cu, etc. is selectively deposited and the wiring can also be formed.

The above Al-CVD method is a film forming method having excellent selectivity and the to surface quality of the deposited film is good. Therefore, a non-selective film forming method is applied to the next depositing step and a metal film made of Al or a metal film containing Al as a main component is also formed onto the foregoing selectively deposited Al film, $SiO_2$ as an insulating film, and the like, so that a preferable metal film having a high generality as a wiring of the semiconductor device can be obtained.

As such a metal film, practically speaking, there can be mentioned combinations of Al, Al—Si, Al—Ti, Al—Cu, Al—Si—Ti, and Al—Si—Cu which have selectively been deposited and Al, Al—Si, Al—Ti, Al—Cu, Al—Si—Ti, and Al—Si—Cu which have non-selectively been deposited, or the like.

As practical examples of the metal of a high melting point which is used for wiring, W, Mo, Ta, Ti, etc. can be mentioned. As an example of silicide, $M_mS_n$ (M is a metal of a high melting point and m and n are integers) can be mentioned. Generally, the combinations of (m, n) are set to (2, 1), (1, 1), and (1, 2).

To form silicide, a reaction at vapor phases of the gas of halide of a metal of a high melting point ($M_oCl_5$, $WC_{15}$, etc.) and the silane gas ($SiH_4$) is generally used. It is the maximum advantage of the vapor phase growing method that an extremely good step coverage is obtained.

As described above, the present invention has the following effects because Al is deposited by a selective CVD method onto the bonding pad portion in which the protecting film is opened.

(1) The bump forming step for TAB can be remarkably simplified.

(2) In the case where a thin wiring such that a film thickness of wiring is equal to or less than 0.6 μm is needed, or in the case where a metal of a high melting point other than Al or a material containing its silicide as a main component is used as a wiring material, the wire bonding can be easily realized with high reliability.

What is claimed is:

1. A method of manufacturing an electronic device having a bonding pad portion, comprising the steps of:

preparing a substrate having a conductor:

forming an insulative film onto said conductor and forming an opening portion in which a surface of a part of said conductor is exposed, said opening portion serving as said bonding pad portion; and selectively vapor phase depositing a metal film on the part of said conductor exposed in said opening portion, so that said metal film on said bonding pad portion is thicker than a thickness of said insulative film, wherein said depositing is conducted with vapor phase depositing using alkylaluminum hydride.

2. A method according to claim 1, wherein said metal film is made of aluminum or aluminum alloy.

3. A method according to claim 1, wherein said conductor is made of a metal selected from the group consisting of W, Mo, Ta and Ti, or a metal silicide.

* * * * *

UNITED STATES PATENT AND TRADEMARK OFFICE
CERTIFICATE OF CORRECTION

PATENT NO. : 5,476,815

DATED : December 19, 1995

INVENTOR : YASUSHI KAWASUMI                    Page 1 of 3

It is certified that error appears in the above-identified patent and that said Letters Patent is hereby corrected as shown below:

On the title page:

AT [56] REFERENCES CITED

"0349696 10/1990 European Pat. Off.." (second occurrence)
    should be deleted

COLUMN 1

Figure 3:
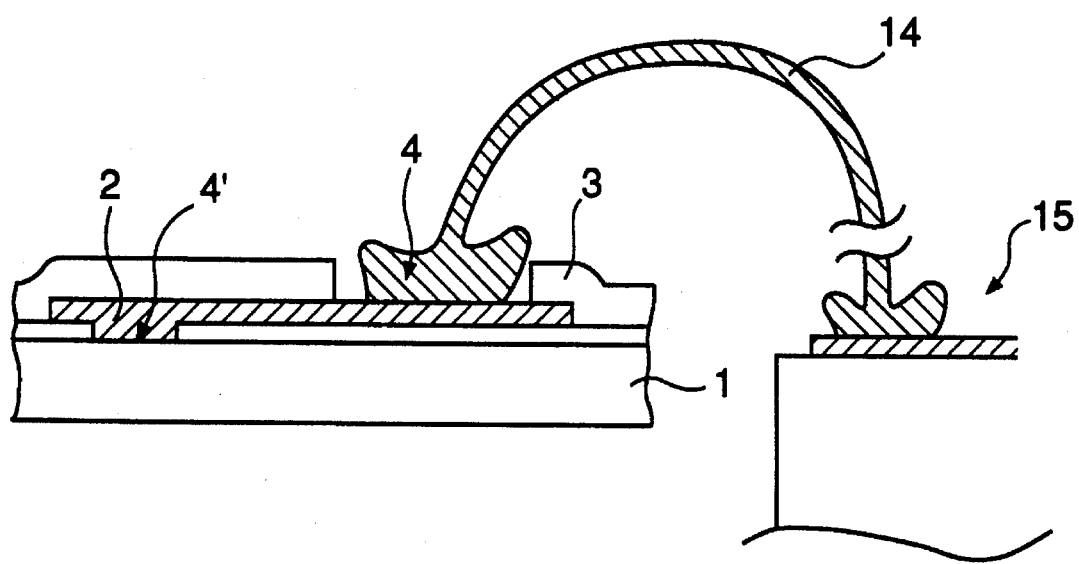
FIG. 3 is a schematic cross sectional view for explaining the conventional wire bonding.

Line 16, "cross sectional" should read
         --cross-sectional--.
    Line 22, "date" should read --date,--.
    Line 38, "A thin metal wire" should read --As seen in
         Fig. 3 a thin metal wire--.
    Line 55, "an" should be deleted.
    Line 66, "an" should read --as--.

UNITED STATES PATENT AND TRADEMARK OFFICE
CERTIFICATE OF CORRECTION

PATENT NO. : 5,476,815

DATED : December 19, 1995

INVENTOR : YASUSHI KAWASUMI

It is certified that error appears in the above-identified patent and that said Letters Patent is hereby corrected as shown below:

COLUMN 2

Line 31, "cross sectional" should read --cross-sectional-- and "line 2-2" should read --line 2A-2A'--.
    Line 34, "cross sectional" should read --cross-sectional--.
    Line 56, "cross sectional" should read --cross-sectional--.

COLUMN 3

Line 33, delete "fairly".
    Line 36, "cross sectional" should read --cross-sectional--.
    Line 52, "hereinlater", should read --later,--.

UNITED STATES PATENT AND TRADEMARK OFFICE
CERTIFICATE OF CORRECTION

PATENT NO. : 5,476,815

DATED : December 19, 1995

INVENTOR : YASUSHI KAWASUMI

It is certified that error appears in the above-identified patent and that said Letters Patent is hereby corrected as shown below:

COLUMN 4

Line 10, "Gazzette" should read --Gazette--.
    Line 60, "mixture gas" should read --gas mixture--.

COLUMN 5

Line 30, "be also" should read --also be--.
    Line 42, "forming" should read --form--.
    Line 47, "to" should be deleted.

Signed and Sealed this

Eighteenth Day of June, 1996

Attest:

BRUCE LEHMAN

Attesting Officer     Commissioner of Patents and Trademarks